(12) United States Patent
Yoon

(10) Patent No.: US 6,726,768 B2
(45) Date of Patent: Apr. 27, 2004

(54) METHOD OF CRYSTALLIZING AMORPHOUS SILICON

(75) Inventor: Jin-Mo Yoon, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 157 days.

(21) Appl. No.: 10/134,480

(22) Filed: Apr. 30, 2002

(65) Prior Publication Data

US 2002/0168577 A1 Nov. 14, 2002

(30) Foreign Application Priority Data

May 11, 2001 (KR) .......................... 2001-25694

(51) Int. Cl.[7] ................... C30B 25/02; C30B 25/04
(52) U.S. Cl. .................... 117/103; 117/43; 117/84; 117/89; 117/93
(58) Field of Search ................. 117/43, 84, 89, 117/93, 103

(56) References Cited

FOREIGN PATENT DOCUMENTS

| JP | 2000-340506 | 12/2000 |
|---|---|---|
| KR | 2000-0001170 | 1/2000 |
| WO | PC-97/45827 A1 | 12/1997 |

*Primary Examiner*—Felisa Hiteshew
(74) *Attorney, Agent, or Firm*—McKenna Long & Aldridge LLP

(57) ABSTRACT

A mask and its application in sequential lateral solidification (SLS) crystallization of amorphous silicon. The mask includes a light absorptive portion that blocks a laser beam and a plurality of tier-shaped light-transmitting portions that pass a laser beam. Each light-transmitting portion has a plurality of adjacent rectangular sub-portions. Adjacent rectangular sub-portions form a step. In operation, the mask moves transversely relative to a amorphous silicon film while a laser performs SLS crystallization. The light portions control grain growth such that high quality polycrystalline silicon is formed.

20 Claims, 22 Drawing Sheets

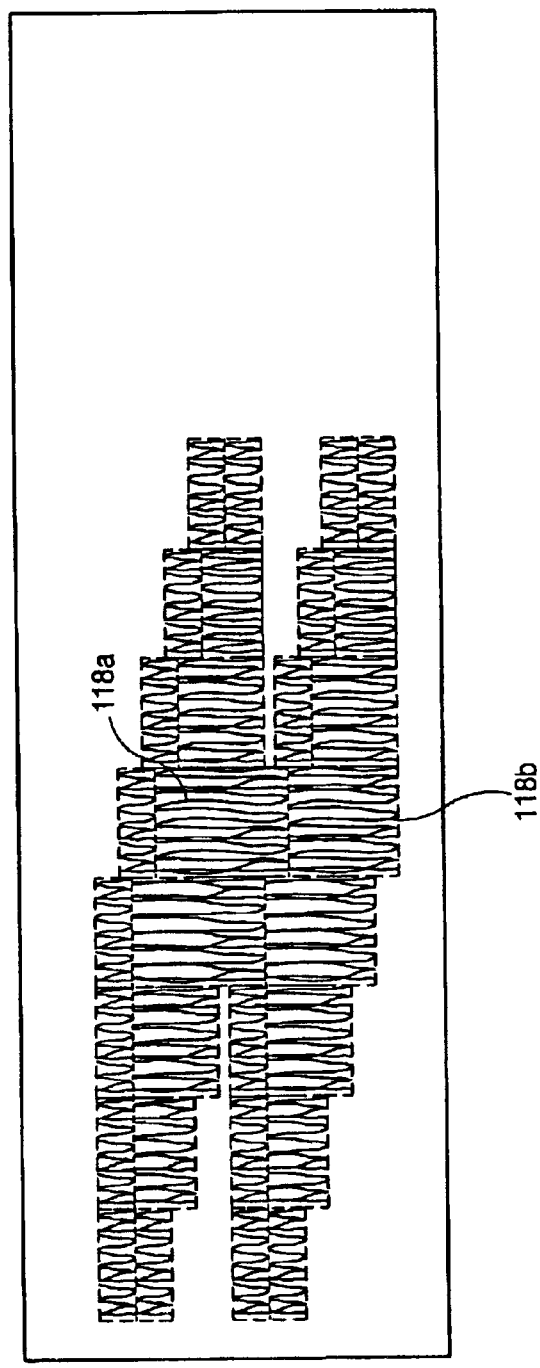

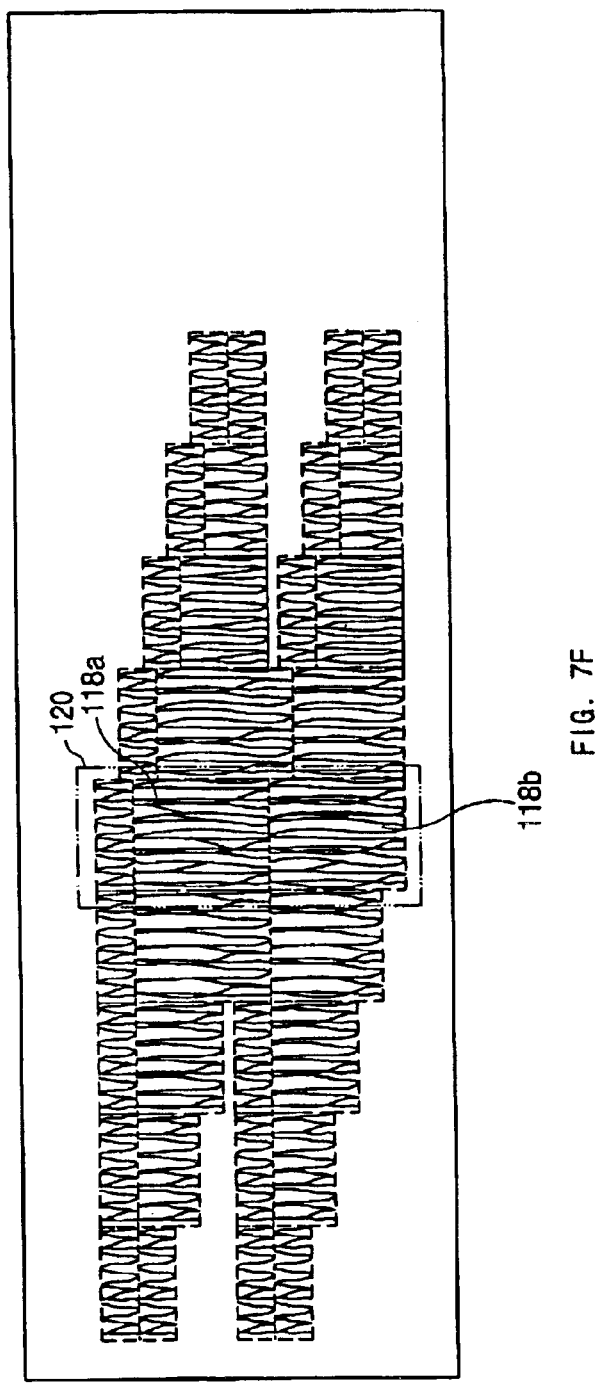

METHOD OF CRYSTALLIZING AMORPHOUS SILICON

This application claims the benefit of Korean Patent Application No. 2001-25694, filed in Korea on May 11, 2001, which is hereby incorporated by reference as if fully set forth herein.

BACKGROUND OF THE INVENTION

1. Field of the Invention

The present invention relates to a method of crystallizing amorphous silicon, and more particularly, to a sequential lateral solidification (SLS) crystallization method.

2. Discussion of Related Art

Polycrystalline silicon (p-Si) and amorphous silicon (a-Si) are often used as the active layer material for thin film transistors (TFTs) in liquid crystal display (LCD) devices. Since amorphous silicon (a-Si) can be deposited at a low temperature to form a thin film on a glass substrate, amorphous silicon (a-Si) is commonly used in liquid crystal displays (LCD). Unfortunately, amorphous silicon (a-Si) TFTs have relatively slow display response times that limit their suitability for large area LCD.

In contrast, polycrystalline silicon TFTs provide much faster display response times. Thus, polycrystalline silicon (p-Si) is well suited for use in large LCD devices, such as laptop computers and wall-mounted television sets. Such applications often require TFTs having field effect mobility greater than 30 $cm^2/Vs$ together with low leakage current.

A polycrystalline silicon film is composed of crystal grains having grain boundaries. The larger the grains and the more regular the grain boundaries the better the field effect mobility. Thus, a silicon crystallization method that produces large grains, ideally a single crystal, would be useful.

One method of crystallizing amorphous silicon into polycrystalline silicon is sequential lateral solidification (SLS). SLS crystallization uses the fact that silicon grains tend to grow laterally from the interface between liquid and solid silicon. With SLS, amorphous silicon is crystallized using a laser beam having a magnitude and a relative motion that melts amorphous silicon such that the melted silicon forms laterally grown silicon grains upon recrystallization.

FIG. 1A is a schematic configuration of a conventional sequential lateral solidification (SLS) apparatus, while FIG. 1B shows a plan view of a conventional mask 38 that is used in the apparatus of FIG. 1A. In FIG. 1A, the SLS apparatus 32 includes a laser generator 36, a mask 38, a condenser lens 40, and an objective lens 42. The laser generator 36 generates and emits a laser beam 34. The intensity of the laser beam 34 is adjusted by an attenuator (not shown) in the path of the laser beam 34. The laser beam 34 is then condensed by the condenser lens 40 and is then directed onto the mask 38.

The mask 38 includes a plurality of slits "A" through which the laser beam 34 passes, and light absorptive areas "B" that absorb the laser beam 34. The width of each slit "A" effectively defines the grain size of the crystallized silicon produced by a first laser irradiation. Furthermore, the distance between each slit "A" defines the size of the lateral grain growth of amorphous silicon crystallized by the SLS method. The objective lens 42 is arranged below the mask and reduces the shape of the laser beam that passed through the mask 38.

Still referring to FIG. 1A, an X-Y stage 46 is arranged adjacent to the objective lens 42. The X-Y stage 46, which is movable in two orthogonal axial directions, includes an x-axial direction drive unit for driving the x-axis stage and a y-axial direction drive unit for driving the y-axis stage. A substrate 44 is placed on the X-Y stage 46 so as to receive light from the objective lens 42. Although not shown in FIG. 1A, it should be understood that an amorphous silicon film is on the substrate 44, thereby defining a sample substrate.

To use the conventional SLS apparatus, the laser generator 36 and the mask 38 are typically fixed in a predetermined position while the X-Y stage 46 moves the amorphous silicon film on the sample substrate 44 in the x-axial and/or y-axial direction. Alternatively, the X-Y stage 46 may be fixed while the mask 38 moves to crystallize the amorphous silicon film on the sample substrate 44.

When performing SLS crystallization, a buffer layer is typically formed on the substrate. Then, the amorphous silicon film is deposited on the buffer layer. Then, the amorphous silicon is crystallized as described above. The amorphous silicon film is usually deposited on the buffer layer using chemical vapor deposition (CVD). Unfortunately, that method produces amorphous silicon with a lot of hydrogen. To reduce the hydrogen content the amorphous silicon film is typically thermal-treated, which causes de-hydrogenation, which results in a smoother crystalline silicon film. If de-hydrogenation is not performed, the surface of the crystalline silicon film is rough, and the electrical characteristics of the crystalline silicon film are degraded.

FIG. 2 is a plan view showing a substrate 44 having a partially-crystallized amorphous silicon film 52. When performing SLS crystallization it is difficult to crystallize all of the amorphous silicon film 52 at once because the laser beam 34 has a limited beam width, and because the mask 38 also has a limited size. Therefore, with large substrates the mask 38 is typically arranged numerous times over the substrate, while crystallization is repeated for the various mask arrangements. In FIG. 2, an area "C" that corresponds to one mask position is defined as a block. Crystallization of the amorphous silicon within a block "C" is achieved by irradiating the laser beam several times.

Crystallization of the amorphous silicon film will be explained as follows. FIGS. 3A to 3C are plan views showing one block of an amorphous silicon film being crystallized using a conventional SLS method. In the illustrated crystallization it should be understood that the mask 38 (see FIGS. 1A and 1B) has three slits.

The length of the lateral growth of a grain is determined by the energy density of the laser beam, by the temperature of substrate, and by the thickness of amorphous silicon film (as well as other factors). The maximum lateral grain growth should be understood as being dependent on optimized conditions. In the SLS method shown in FIGS. 3A to 3C, the width of the slits is twice as large as the maximum lateral grain growth.

FIG. 3A shows an initial step of crystallizing the amorphous silicon film using a first laser beam irradiation. As described with reference to FIG. 1A, the laser beam 34 passes through the mask 38 and irradiates one block of an amorphous silicon film 52 on the sample substrate 44. The laser beam 34 is divided into three line beams by the three slits "A." The three line beams irradiate and melt regions "D," "E," and "F" of the amorphous silicon film 52. The energy density of the line beams should be sufficient to induce complete melting of the amorphous silicon film 52.

Still referring to FIG. 3A, after complete melting the liquid phase silicon begins to crystallize at the interfaces 56a and 56b between the solid phase amorphous silicon and the liquid phase silicon. Namely, lateral grain growth of grains 58a and 58b proceeds from the un-melted regions to the fully-melted regions. Lateral growth stops in accordance with the width of the melted silicon region when: (1) grains grown from interfaces collide near a middle section 50a of the melted silicon region; or (2) polycrystalline silicon particles are formed in the middle section 50a as the melted silicon region solidifies sufficiently to generate solidification nuclei.

Since the width of the slits "A" (see FIG. 1B) is twice as large as the maximum lateral growth length of the grains, the width of the melted silicon region "D," "E," or "F" is also twice as large as the maximum lateral growth length of the grains. Therefore, lateral grain growth stops when the polycrystalline silicon particles are formed in the middle section 50a. Such polycrystalline silicon particles act as solidification nuclei in a subsequent crystallization step.

As discussed above, the grain boundaries in directionally solidified silicon tend to form perpendicular to the interfaces 56a and 56b between the solid phase amorphous silicon and the liquid phase silicon. As a result of the first laser beam irradiation, crystallized regions "D," "E," and "F" are formed in one block. Additionally, solidification nuclei regions 50a are also formed.

As mentioned before, the length of lateral grain growth attained by a single laser irradiation depends on the laser energy density, the temperature of substrate, and the thickness of the amorphous silicon film. In the above-mentioned first laser beam irradiation, the grains generated by the lateral growth typically have a length ranging from 1.5 to 3 micrometers.

FIG. 3B shows crystallizing the amorphous silicon film using a second laser beam irradiation. After the first laser beam irradiation, the X-Y stage or the mask 38 moves in a direction opposite to the lateral grain growth of the grains 58a or 58b (in FIG. 3A) by a distance of several micrometers, which is the same as or less than the maximum length of the lateral grain growth. Then, the second laser beam irradiation is conducted. The regions irradiated by the second laser beam are melted and crystallized as described above. The silicon grains 58a and 58b or/and the nuclei regions 50a generated by the first laser beam irradiation serve as seeds for the second crystallization. Thus, the lateral grain growth proceeds in the second melted regions. Silicon grains 58c formed by the second laser beam irradiation continue to grow adjacent to the silicon grains 58a formed by the first laser beam irradiation, and silicon grains 58d grown from an interface 56c are also formed. The lateral growth of these grains 58c and 58d stops when the nuclei regions 50b are formed in a middle section of the silicon region melted by the second laser beam irradiation.

Accordingly, by repeating the foregoing steps of melting and crystallizing, one block of the amorphous silicon film is crystallized to form grains 58e as shown in FIG. 3C.

The above-mentioned crystallization processes conducted within one block are repeated block by block across the amorphous silicon film 52. Therefore, the large size amorphous silicon film is converted into a crystalline silicon film. While generally successful, the conventional SLS method described above has disadvantages.

Although the conventional SLS method produces large size grains, the X-Y stage or the mask must repeatedly move a distance of several micrometers to induce lateral grain growth. Therefore, the time required to move the X-Y stage or the mask 38 occupies a major part of the total crystallization time. This significantly decreases manufacturing efficiency.

FIG. 4 is a plan view of a mask 60 that is used in another SLS method. The mask 60 has light slits "G" and light absorptive areas "H." Although the mask 60 is similar to the mask 38, the width of the lateral stripe-shaped slits "G" is less than twice the maximum lateral grain growth length. Due to the smaller width of the slits "G" the lateral grain growth stops when the grains generated at the interface between the un-melted regions and the fully-melted regions collide. In contrast to the crystallization described in FIGS. 3A to 3C, solidification nuclei regions 50a and 50b are not formed when using the mask 60.

The SLS using the mask 60 will now be discussed. As described with reference to FIG. 1A, the laser beam 34 passes through the mask 60 and irradiates the amorphous silicon film on the sample substrate 44. The laser beam 34 is divided into three line beams (because there are three slits "G"). Those line beams are reduced by the objective lens 42 to create beam patterns on the amorphous silicon film. As crystallization proceeds, the beam patterns move in an X-axis direction. Because of the X-axis directional movement, crystallization is conducted along a length of the beam pattern. As previously described, the X-Y stage 46 or the mask 60 moves by a distance of several millimeters (mm). The larger movement reduces the processing time when compared to the SLS method described with reference to FIGS. 3A to 3C.

FIGS. 5A to 5C are plan views showing an amorphous silicon film being crystallized using the mask shown in FIG. 4. It is assumed that the mask 60 has three slits. As mentioned above, the length of the lateral grain growth is determined by the energy density of the laser beam 34, the temperature of the substrate, the thickness of the amorphous silicon film, etc. Thus, lateral grain growth is maximized under optimized conditions. In FIGS. 5A to 5C, it should be understood that the width of the slits "G" (in FIG. 4) is smaller than twice the maximum length of the lateral grain growth.

FIG. 5A shows an initial step of crystallizing the amorphous silicon film. Referring to both FIGS. 1A and 5A, the laser beam 34 emitted from the laser generator 36 passes through the mask 60 (which replaces the mask 38) and irradiates a first block E1 of an amorphous silicon film 62 deposited on the sample substrate 44. The laser beam 34 is divided into three line beams by the slits "G." The three line beams irradiate and melt regions "I," "J." and "K" of the amorphous silicon film 62. Since each of the melted regions "I", "J" and "K" corresponds to a slit "G," the width of the melted regions "I," "J.," or "K" is less than twice the maximum lateral grain growth. The energy density of the line beams should be sufficient to induce complete melting of the amorphous silicon film.

The liquid phase silicon begins crystallize at the interfaces 66a and 66b between the solid phase amorphous silicon and the liquid phase silicon. Namely, the lateral grain growth of the grains 68a and 68b proceeds from un-melted regions adjacent the fully-melted regions. Then, lateral growth stops in accordance with the width of the melted silicon region when the grains 68a and 68b collide in middle lines 60a of the melted silicon region. The grain boundaries in directionally solidified silicon tend to form perpendicular to the interfaces 66a and 66b between the solid phase amorphous silicon and the liquid phase silicon. As a result of the first laser beam irradiation, the first block E1 is partially crystallized. Thereafter, by way of moving the X-Y stage where the substrate is mounted, the beam patterns moves in the X-axis direction by a distance of several millimeters (mm). Thus, the second irradiation is conducted and the second block E2 is partially crystallized. The crystallization in the X-axis direction is then repeatedly carried out.

As a result of the first to third laser beam irradiations described in FIG. 5A, crystallized regions "I," "J," and "K" are formed in the first to third blocks E1, E2 and E3, each of which corresponds to the mask 60 of FIG. 4, such that crystallized silicon grain regions "I," "J.," and "K" result.

In FIG. 5B, after the first laser beam irradiation, the X-Y stage or the mask moves in a direction opposite to the lateral growth of the grains 68a or 68b of FIG. 5A by a distance of several or several tens of micrometers more or less than the maximum length of the lateral growth. Namely, crystallization is conducted block by block in a Y-axis direction. Therefore, the regions irradiated by the laser beam are melted and then crystallized in the manner described in FIG. 5A. At this time, the silicon grains 68a or/and 68b grown by the first to third laser beam irradiations serve as seeds for this crystallization, and thus the lateral grain growth proceeds in the melted regions in the Y-axis direction. Silicon grains 68c formed by the sequential lateral solidification (SLS) continue to grow adjacent to the silicon grains 68a of FIG. 5A, and silicon grains 68d solidified from an interface 66c are also formed. These grains 68c and 68d collide with each other at a middle line 60b of the silicon regions melted by the Y-axial laser beam irradiation, thereby stopping the lateral grain growth.

Accordingly, by repeating the foregoing steps of melting and crystallizing the amorphous silicon, the blocks E1, E2 and E3 of the amorphous silicon film become crystallized to form grains 68e as shown in FIG. 5C. FIG. 5C is a plan view showing a crystalline silicon film that resulted from lateral growth of grains to predetermined sizes.

The conventional SLS methods described in FIGS. 3A to 3C and 5A and 5C have some disadvantages. The conventional SLS method takes a relatively long time to crystallize the amorphous silicon film, thereby causing the decrease of the manufacturing yield. Furthermore, due to the width of slit of the mask, the length of lateral grain growth is limited.

SUMMARY OF THE INVENTION

Accordingly, the present invention is directed to a method of crystallizing an amorphous silicon film using a sequential lateral solidification (SLS) that substantially obviates one or more of problems due to limitations and disadvantages of the related art.

An advantage of the present invention is to provide a sequential lateral solidification (SLS) method that saves time.

Another advantage of the present invention is to provide a method of crystallizing an amorphous silicon layer having increased manufacturing yield.

Additional features and advantages of the invention will be set forth in the description which follows, and in part will be apparent from that description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method for crystallizing an amorphous silicon film in a sequential lateral solidification (SLS) apparatus includes the steps of locating a substrate in a sequential lateral solidification (SLS) apparatus, wherein the substrate has an amorphous silicon film. Then, irradiating the amorphous silicon film using a laser beam that passes through a mask, wherein the mask is installed in the SLS apparatus and includes a light absorptive portion and a plurality of light-transmitting portions each shaped like tiers, wherein each light-transmitting portion has a plurality of rectangular sub-portions that are adjacent to each other, wherein a width of each rectangular sub-portion is several micrometers, for example, greater than 1 micrometer and less than 10 micrometers, and wherein a length of each rectangular sub-portion ranges from several hundreds micrometers (e.g., 200 micrometers) to sever millimeters. Then, forming first crystallized regions that correspond to the light-transmitting portions, wherein each crystallized region has a plurality of silicon sub-portions, each having a first grain region, a second grain region, and a middle section. The grains of the first and second grain regions grow vertically against the interface between liquid and solid silicon. Then, moving the mask in a transverse direction for a next crystallization, with the movement being the length of the rectangular sub-portions. Then, performing a second crystallization to form second crystallized regions wherein the second grain regions of the first crystallized regions continue their growth. The, repeating forming the first crystallized regions, moving the mask and performing the second crystallization until the amorphous silicon film is crystallized in the transverse direction. The method for crystallizing an amorphous silicon film further includes a step of moving the mask in a longitudinal direction after finishing the transverse directional crystallization, and then further includes a step of conducting a second transverse directional crystallization after moving the mask in the longitudinal direction.

In the above method, the adjacent rectangular sub-portions of the mask constitute a step. The step between adjacent rectangular sub-portions is larger than or smaller than the maximum length of lateral growth of the grains. The width of each rectangular sub-portion is equal to or less then twice the maximum length of the lateral grain growth. At this time, the middle section of the each silicon sub-portion is a collision region where grains laterally growing from opposite side interfaces collide. Alternatively, the width of each rectangular sub-portion can be equal to or larger then twice the maximum length of lateral grain growth. The middle section of the each silicon sub-portion then acts as a nucleus region.

In another aspect, a mask for crystallizing an amorphous silicon film using a sequential lateral solidification (SLS) apparatus includes a light absorptive portion that blocks a laser beam, and a plurality of light-transmitting portions through which the laser beam passes, each of which is tier shaped. Each light-transmitting portion includes a plurality of adjacent rectangular sub-portions. A width of each rectangular sub-portion is equal to or several micrometers less then twice the maximum lateral grain growth. Alternatively, the width of each rectangular sub-portion can be equal to or larger then twice the maximum lateral grain growth. Adjacent rectangular sub-portions of the mask constitute a step. The step between the adjacent rectangular sub-portions is larger than or smaller than the maximum lateral grain growth. A length of each rectangular sub-portion ranges from several hundreds micrometers to several millimeters.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 7A to 7I are plan views showing a crystallization process using the mask of FIG. 6;

DETAILED DESCRIPTION OF THE ILLUSTRATED EMBODIMENTS

Reference will now be made in detail to illustrated embodiments of the present invention, examples of which are shown in the accompanying drawings. Wherever possible, similar reference numbers will be used throughout the drawings to refer to the same or to like parts.

Figure 1A:
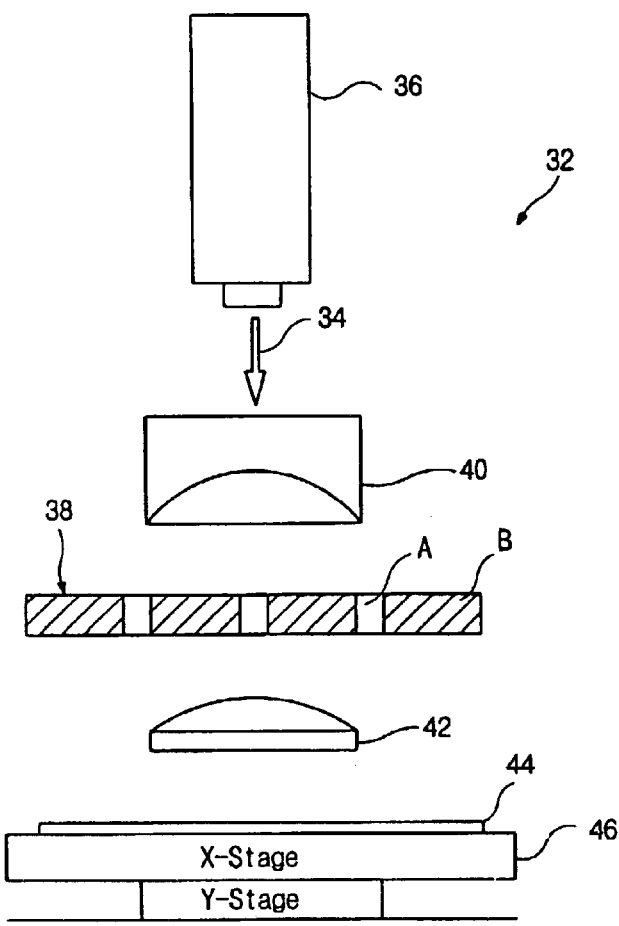
FIG. 1A is a schematic configuration of a conventional sequential lateral solidification (SLS) apparatus.
Figure 1B:
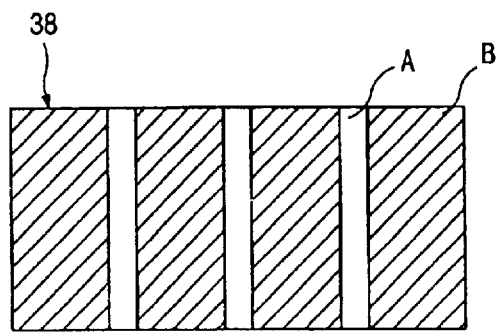
FIG. 1B is a plan view showing a mask of FIG. 1A.
Figure 2:
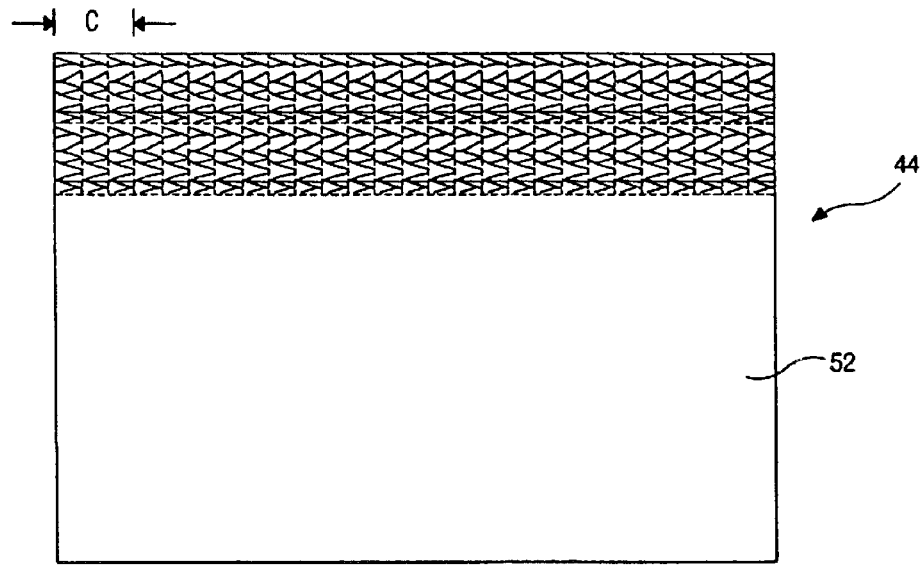
FIG. 2 illustrates a substrate having a partially-crystallized amorphous silicon film.
Figure 3A:
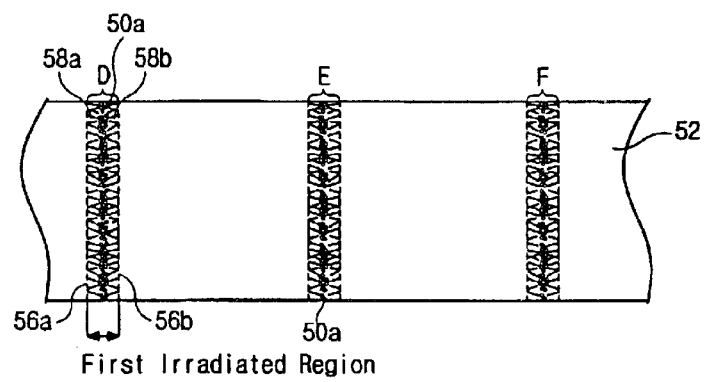
FIGS. 3A to 3C are plan views showing one block of an amorphous silicon film being crystallized using a conventional SLS method.
Figure 3B:
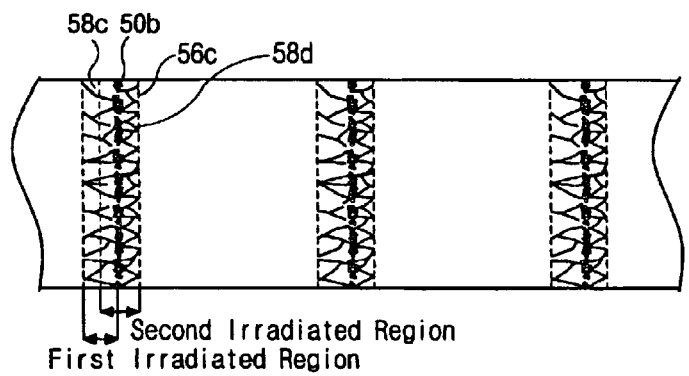
Figure 3C:
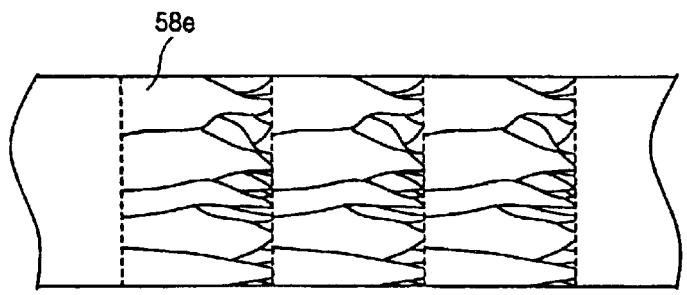
Figure 4:
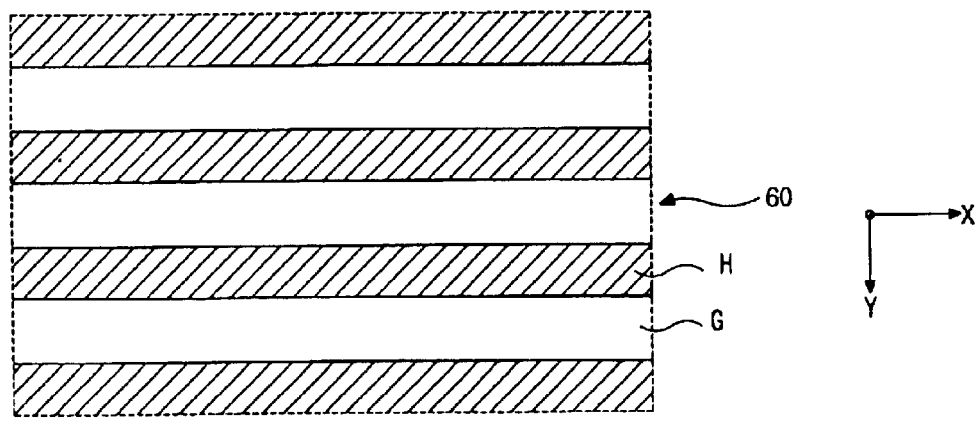
FIG. 4 is a plan view of a SLS crystallization mask.
Figure 5A:
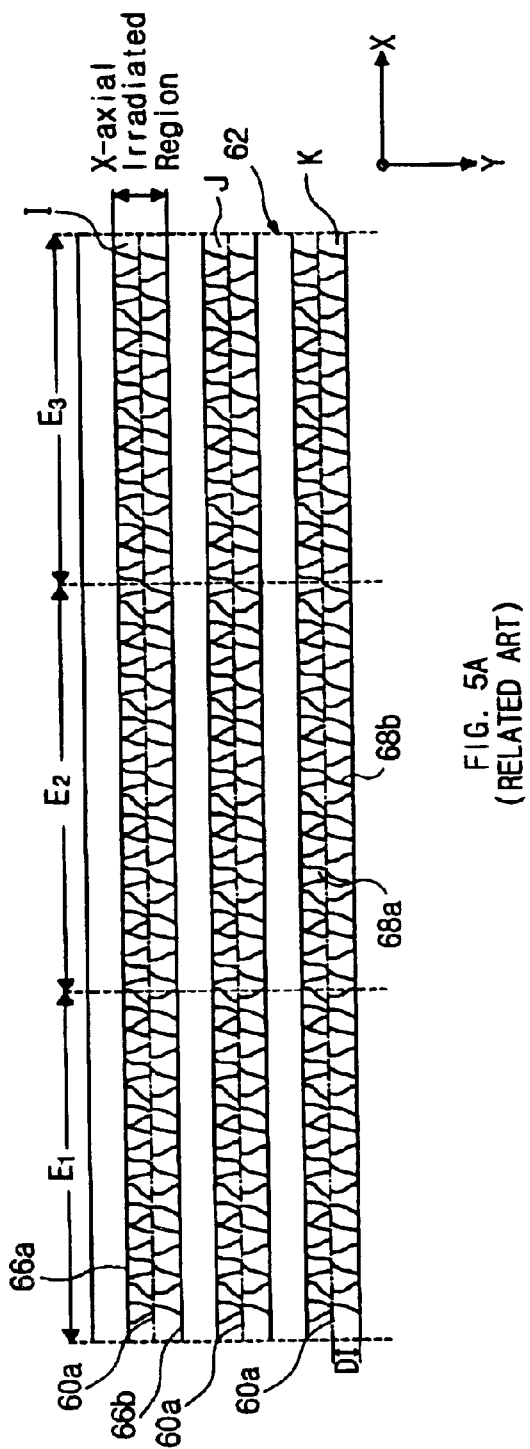
FIGS. 5A to 5C are plan views showing an amorphous silicon film being crystallized using the mask shown in FIG. 4.
Figure 5B:
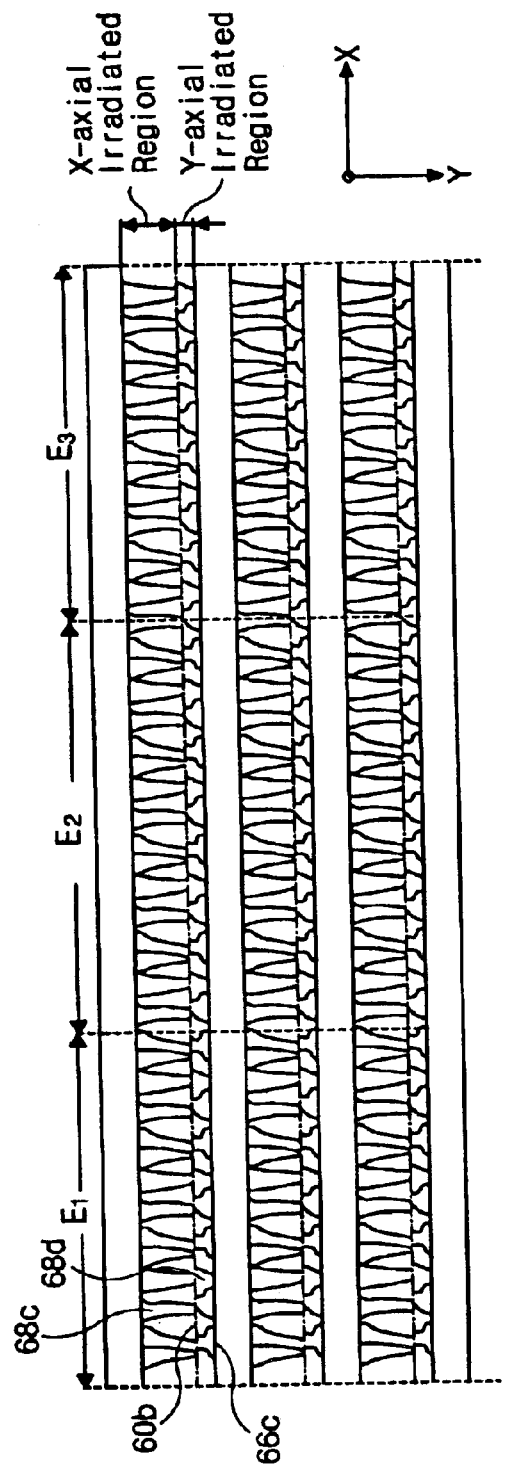
Figure 5C:
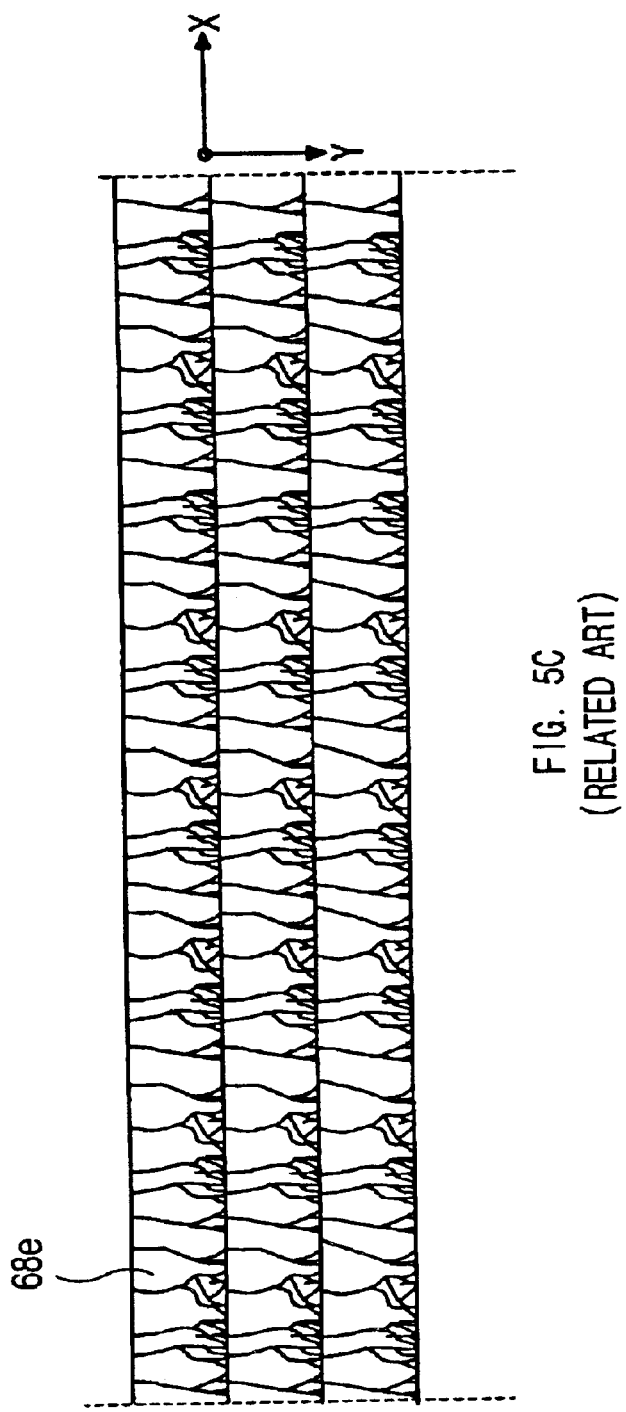
Figure 6:
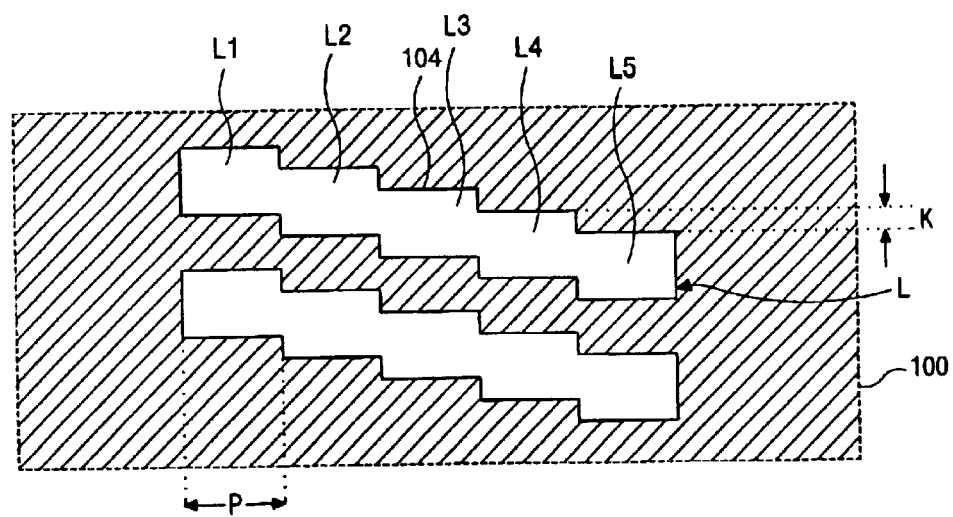
FIG. 6 is a plan view of an SLS crystallization mask according to a first embodiment of the present invention.

FIG. 6 is a plan view of an SLS crystallization mask 100 that is in accord with a first embodiment of the present invention. As shown, the mask 100 includes a plurality of tier-shaped light-transmitting portions "L." Each light-transmitting portion "L" includes rectangular shaped first to fifth sub-portions L1, L2, L3, L4 and L5. Each of light-transmitting sub-portions L1–L5 is referred to hereinafter as a "rectangular sub-portion." Each of the rectangular sub-portions L1–L5 has a length "P" of several hundreds micrometers ($\mu$m) to several millimeters (mm) (i.e., greater than 200 micrometers), and a width of several micrometers ($\mu$m) (e.g., greater than 1 micrometer and less than 10 micrometers). In the first embodiment of the present invention, the width of the rectangular sub-portions is the same as, or is larger than, twice the maximum lateral grain growth length. The rectangular sub-portions L1–L5 are joined with a step "K" that is less than the maximum lateral grain growth length. Namely, the second rectangular sub-portion L2 is arranged in a lower position than the first rectangular sub-portion L1 by the size of the step "K." Therefore, when the mask 100 or an X-Y stage moves by a length "P" of several hundreds micrometers ($\mu$m) to several millimeters (mm) (i.e., substantially more than 200 micrometers) to prepare for a subsequent crystallization step, the beam patterns created by the rectangular sub-portions L1, L2, L3, L4 and L5 include a middle section or line that corresponds with middle sections of a crystallized region. That is, referring now briefly to FIG. 7B, the first to fourth rectangular sub-portions L1–L4 of the mask overlap middle sections 114 of crystallized region.

With respect to the middle section of the crystallized region, the characteristics and property of the middle section are closely related to the maximum length of lateral grain growth and to the width of the rectangular sub-portion. If the width of the rectangular sub-portion is less than or equal to twice the maximum length of lateral grain growth, the middle section becomes a collision region where the grains laterally growing from opposite sides collide. Further, if the width of the rectangular sub-portions is larger than or equal to twice the maximum length of lateral grain growth, the middle section becomes a nucleus region that contains polycrystalline silicon particles.

FIGS. 7A to 7I are plan views that show the crystallization process using the mask 100 of FIG. 6. Whenever the laser beam irradiates the amorphous silicon film, the mask 100 is positioned between the substrate 110 and the laser generator.

Figure 7A:
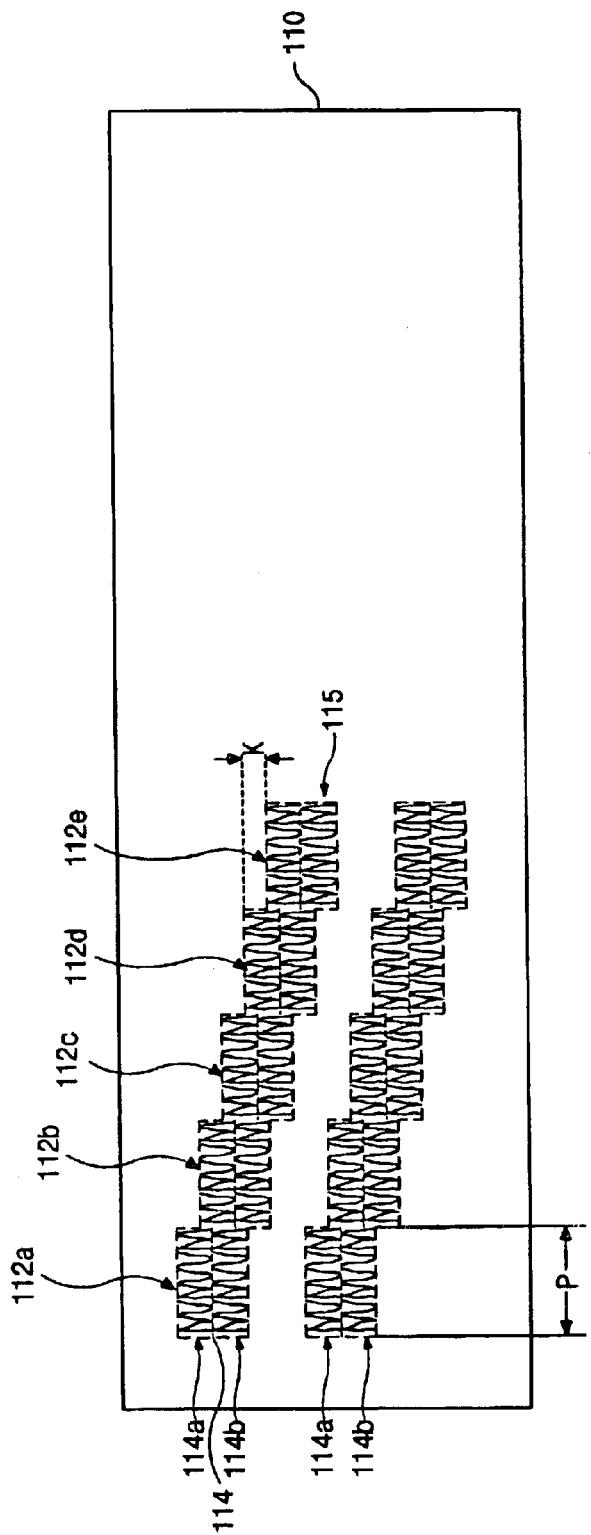

Referring to FIG. 7A, the mask 100 (in FIG. 6) is arranged above the substrate 110, which is fixed on the X-Y stage. An amorphous silicon film is disposed on the substrate 110. As mentioned before, the mask 100 includes light-transmitting portions "L" that have first to fifth rectangular sub-portions L1–L5. Thereafter, the first laser beam irradiation is carried out such that the amorphous silicon sub-portions 112a–112e that correspond to the rectangular sub-portions L1–L5 are melted and subsequently crystallized.

Crystallized regions 115 that correspond to the light-transmitting portion "L" of FIG. 6 are formed on the substrate 110. In each crystallized region 115 there are first grain regions 114a, second grain regions 114b, and middle sections 114. When the first laser beam irradiation is stopped, the melted silicon rapidly crystallizes at the interfaces between the solid phase amorphous silicon and the liquid phase silicon. The first grain regions 114a are formed in a downward direction from the interface to the center, and the second grain regions 114b are formed in an upward direction from the interface to the center. Therefore, the first and second grain regions 114a and 114b meet in the central part of each silicon sub-portion 112a (112b, 112c, 112d or 112e), thereby inducing the middle section 114, which is a collision region or a place where nuclei are formed. Between each of the silicon sub-portions 112a and 112b (112b and 112c, 112c and 112d or 112d and 112e), there is the step "K" that is smaller than a lateral grain length of the first grain region 114a.

After the first laser bean irradiation, the X-Y stage or/and the mask 100 moves for the next laser beam irradiation by a distance of several millimeters (mm). Namely, the substrate 110 moves left, for example, by the length "P" of the silicon sub-portions (112a–112e).

Figure 7B:
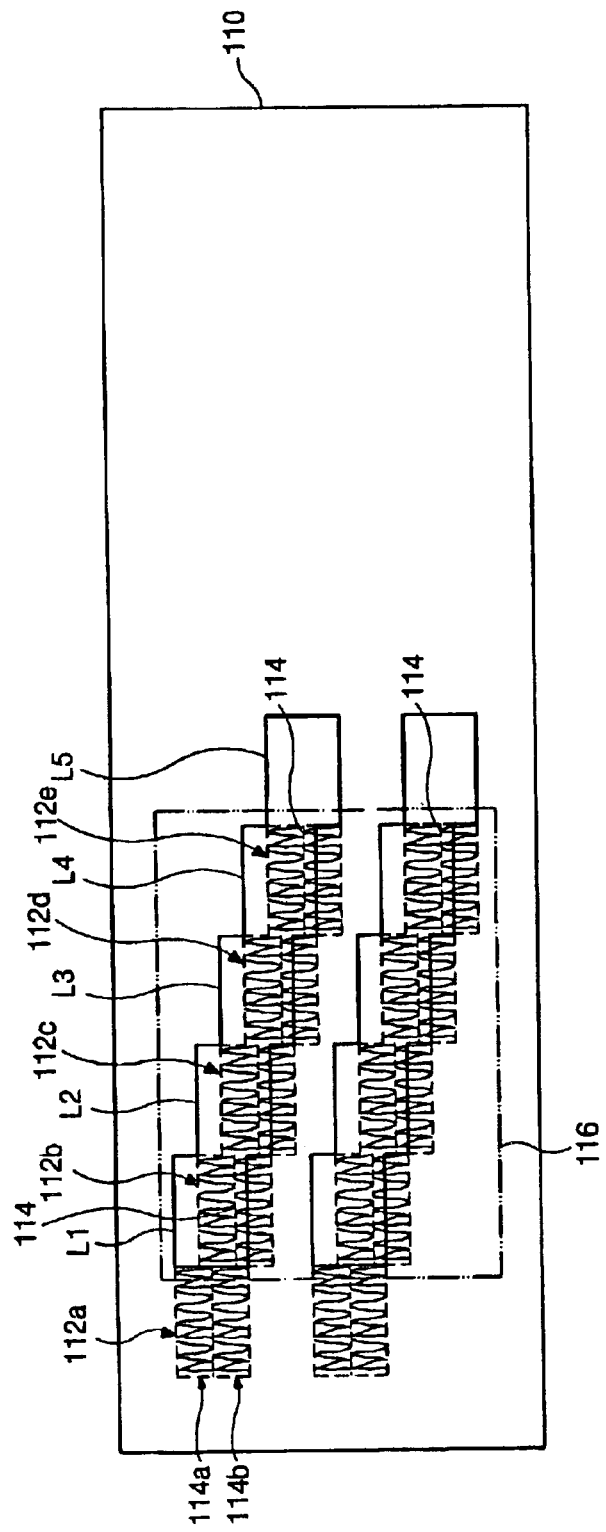

Now referring to FIG. 7B, the first to fifth rectangular sub-portions L1–L5 move right, and thus, the first to fourth rectangular sub-portions L1–L4 are arranged above the second to fifth silicon sub-portions 112b–112e, respectively. When the first to fourth rectangular sub-portions L1–L4 overlap the second to fifth silicon portions 112b–112e, each of the first to fourth rectangular sub-portions L1–L4 exposes the middle section 114, the first grain region 114a, and a portion of a second grain region 114b of the second to fifth silicon portions 112b–112e. Then, a second laser beam irradiation is conducted through the first to fifth rectangular sub-portions L1–L5.

Figure 7C:
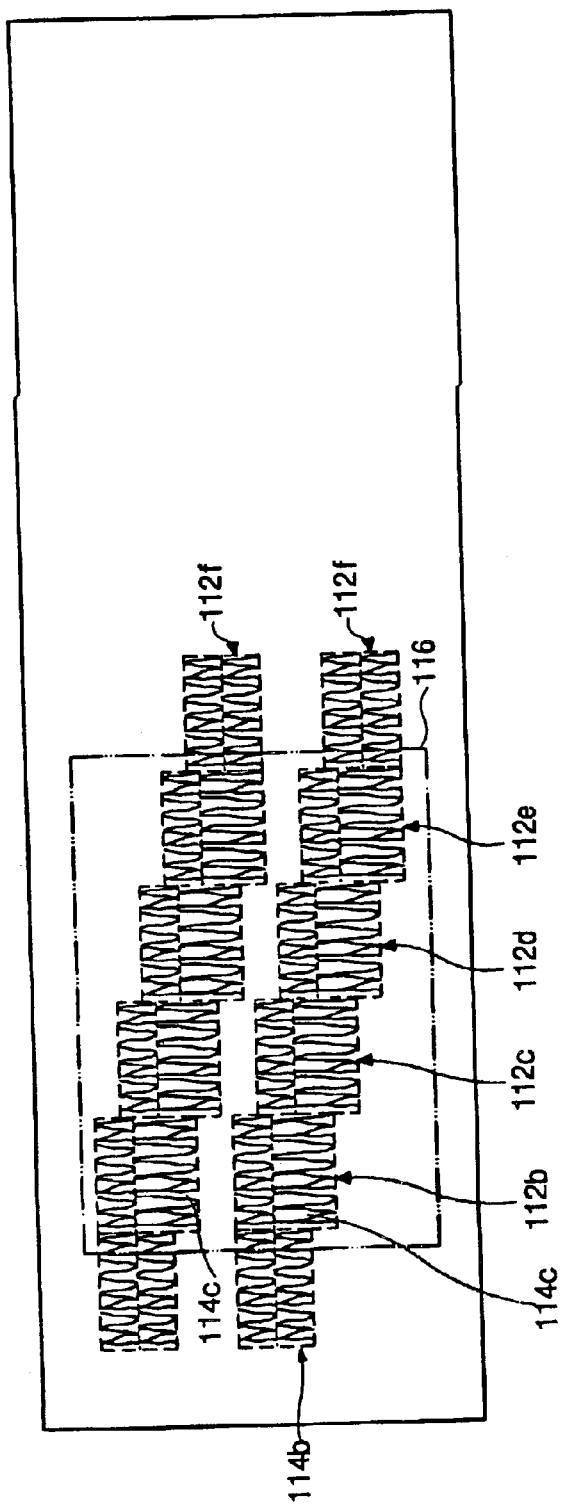

Therefore, while the second laser beam irradiation is carried out, the portions of the amorphous silicon film below the first to fifth rectangular sub-portions L1–L5 are re-melted. After the second laser beam irradiation, the second grain regions 114b of the second to fifth silicon sub-portions 112b–112e tend to grow in an upward direction to form third grain regions 114c as shown in FIG. 7C. Namely, the third grain regions 114c formed by the second laser beam irradiation continue to grow adjacent to the second grain regions 114b formed by the first laser beam irradiation, and thus the grains tend to grow vertically against the interface between liquid and solid silicon. In an area 116 where the rectangular sub-portions of the mask expose the second to fifth silicon sub-portions 112b–112e, the larger grains 114c can be obtained as shown in FIG. 7C. Furthermore, new sixth crystallized silicon sub-portions 112f are formed adjacent to the fifth silicon sub-portions 112e.

Figure 7D:
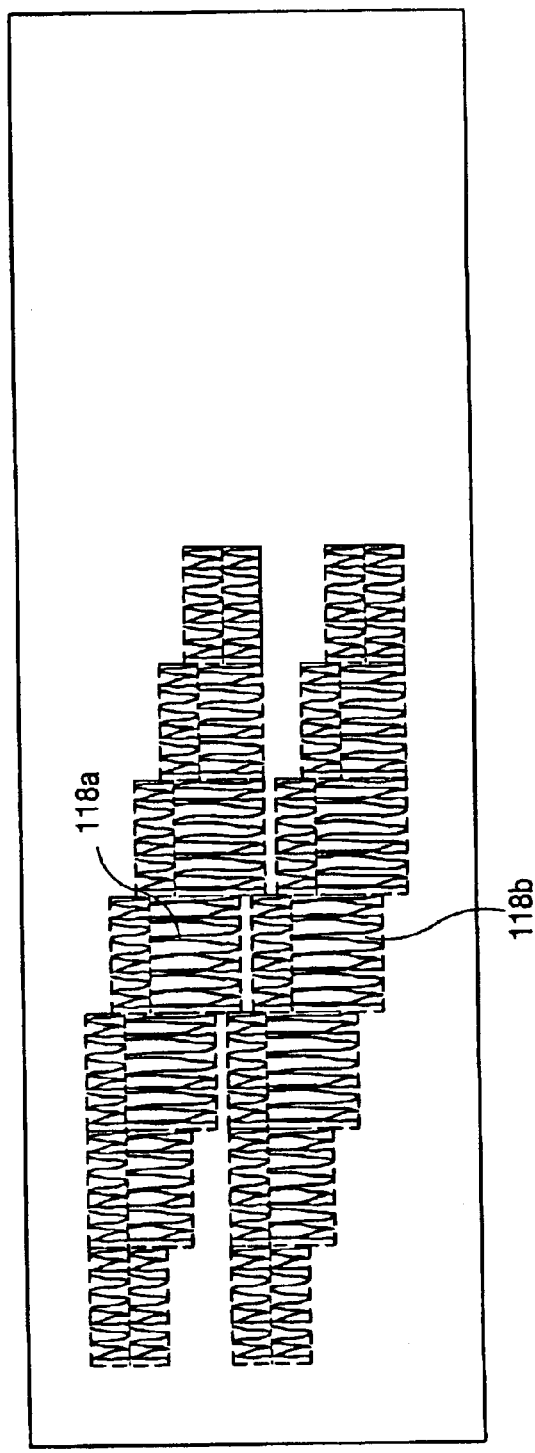

Referring now to FIGS. 7D and 7E, the repetition of the foregoing steps of melting and crystallizing forms larger grains 118a and 118b that have continuously grown from the grains 114c of FIG. 7C. Actually, the growth of the grain according to the present invention does not have any limitation because the length of lateral growth of the grains becomes larger as the number of the rectangular sub-portions increases. However, when the plural light-transmitting portions "L" are formed in the mask 100 (see FIG. 6), the length of lateral growth of the grains is limited by a distance between the adjacent light-transmitting portions "L."

In FIGS. 7E and 7F, the larger grains 118a and 118b border on each other as shown in an area 120 (see FIG. 7F). When crystallization proceeds in a transverse direction (X-axial direction), the crystallized regions formed by adjacent light-transmitting portions of the mask 100 meet and create a boundary. Therefore, the lateral grain growth stops at this boundary of the adjacent crystallized regions 118a and 118b.

Figure 7G:
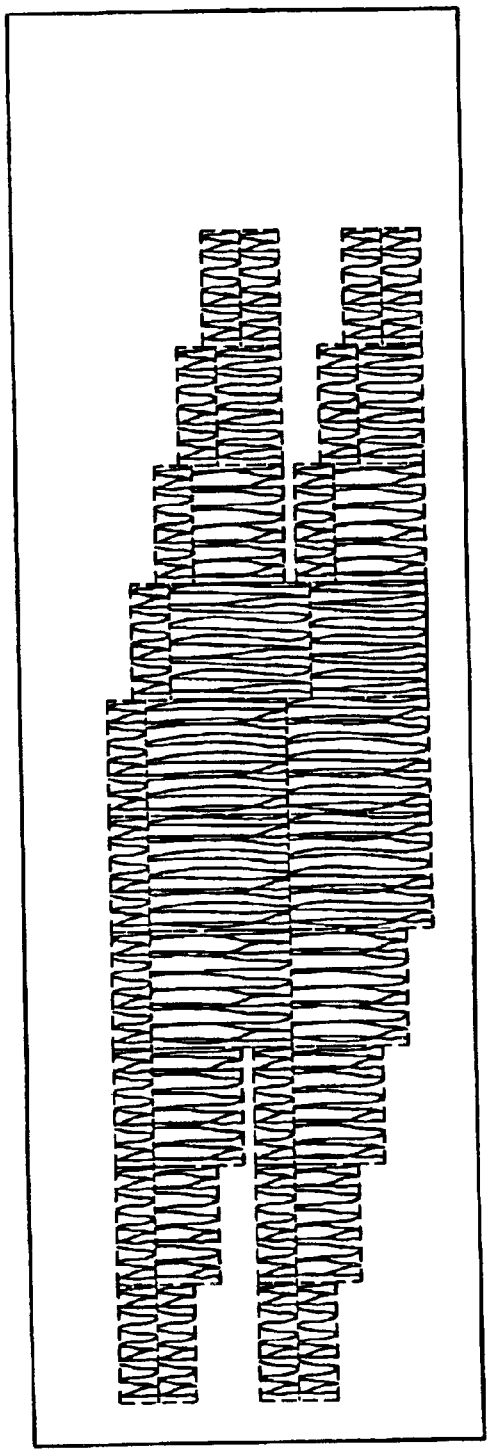
Figure 7H:
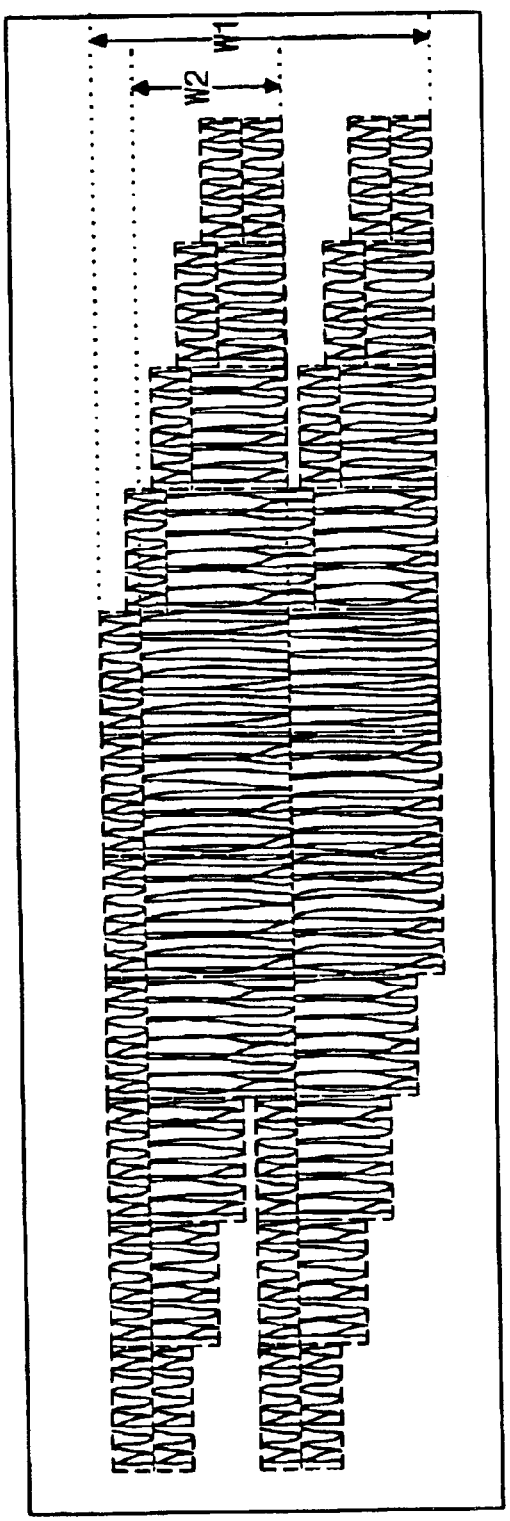
Figure 71:
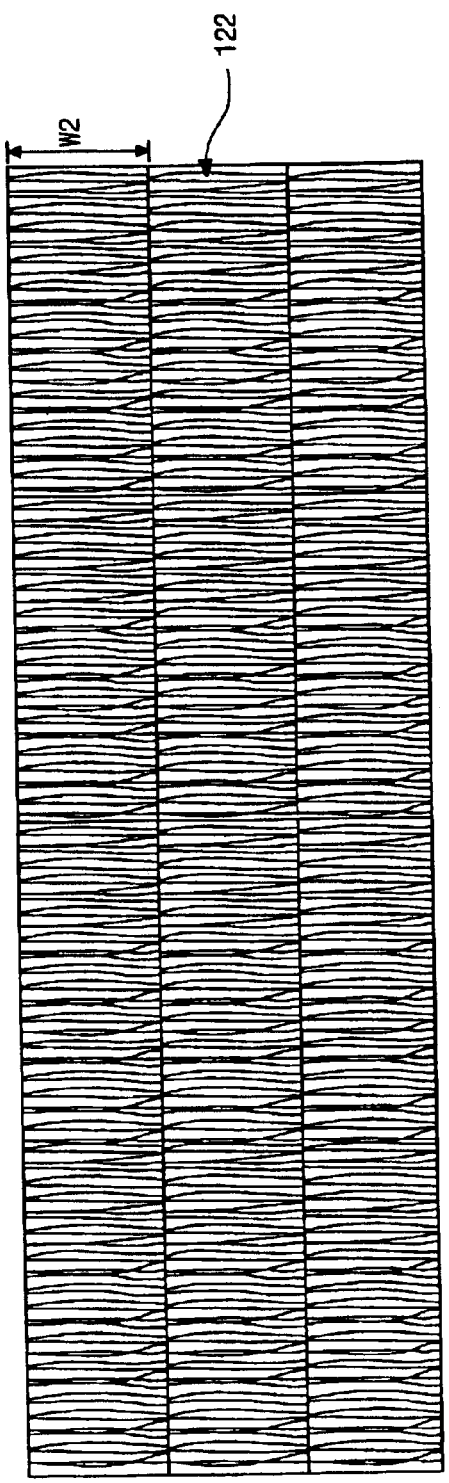

Referring now to FIGS. 7G and 7H, as crystallization continues in the transverse direction using the mask of FIG. 6, larger grains are formed. When the mask 100 has two light-transmitting portions, the amorphous silicon film deposited on the substrate 110 is crystallized into crystalline silicon having a width W1. Each light-transmitting portion "L" of FIG. 6 creates a grain having a width W2 as shown in FIGS. 7H and 7I.

After completing crystallization in the transverse direction, the X-Y stage or the mask moves in a longitudinal direction (Y-axial direction) by a distance of several millimeters for another X-axial directional crystallization. After all Y-axial movements and X-axial crystallizations are done the entire amorphous silicon film is fully crystallized as shown in FIG. 7I. A crystalline silicon layer 122 has crystallized regions with a width W2, which is completed in a relatively short time period. Since the X-Y stage or the mask moves by several millimeters for subsequent crystallizations, the silicon film crystallization is completed much faster than in the conventional art. The crystalline silicon layer 122 is suitable for use in a thin film transistor, as well as for other purposes.

Figure 8:
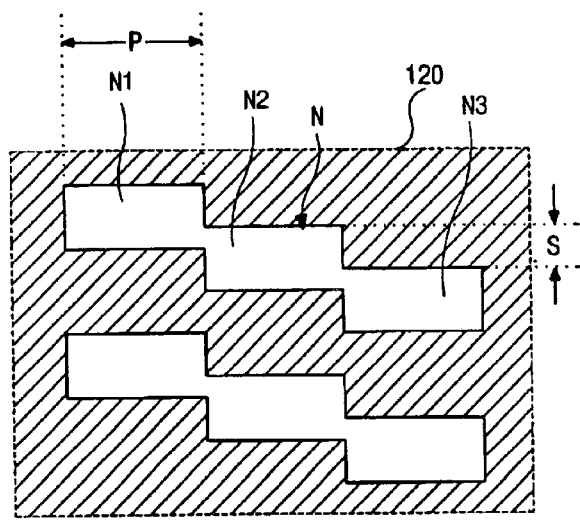
FIG. 8 is a plan view of an SLS crystallization mask according to a second embodiment of the present invention.

FIG. 8 is a plan view of a mask that is used for crystallization according to a second embodiment of the present invention. Although a mask 120 is visually similar to the mask of FIG. 6, the mask 120 has a much larger step, (step "S" relative to step "K" of FIG. 6).

As shown in FIG. 8, the mask 120 includes multiple light-transmitting portions "N," each of which is tier-shaped. Each light-transmitting portion "N" includes first to third sub-portions N1, N2, and N3, each of which is rectangular. Each of the light-transmitting sub-portions N1–N3 will be referred to hereinafter as a "rectangular sub-portion." Each of the rectangular sub-portions N1–N3 has a length "P" of several hundreds micrometers ($\mu$m) to several millimeters (mm) (e.g., more than 200 micrometers) and a width of several micrometers ($\mu$m) (e.g., greater than one micrometer and less than ten micrometers). In the second embodiment of the present invention, the width of several micrometers ($\mu$m) is less than or equal to twice the maximum length of lateral grain growth. Since the step "S" between adjacent rectangular sub-portions N1–N3 is greater than the maximum length of lateral grain growth, the second rectangular sub-portion N2 is positioned much lower than the first sub-portion N1. As a result, when crystallizing an amorphous silicon film using the mask 120 it is possible to crystallize a larger region per unit time. However, when compared to the first embodiment, the length of lateral grain growth of the second embodiment is less.

Furthermore, since the width of each of the rectangular sub-portions N1–N3 is less than or equal to twice the maximum length of lateral grain growth, the laterally growing grains collide with each other in the middle section.

FIGS. 9A to 9G are plan views showing the steps of crystallizing an amorphous silicon film using the mask of FIG. 8.

Figure 9A:
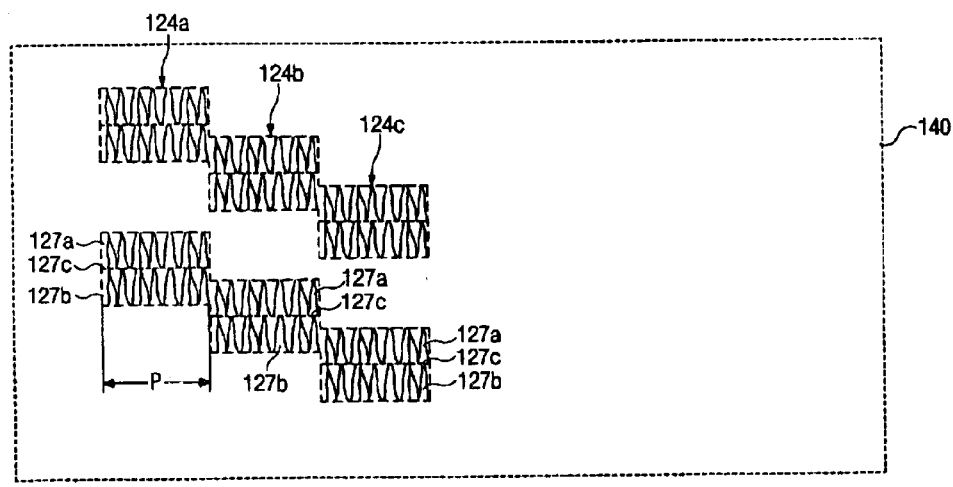
FIGS. 9A to 9G are plan views showing a crystallization process using the mask of FIG. 8.

Referring now to FIG. 9A, the mask of FIG. 8 is disposed above the substrate 140, which is mounted on the X-Y stage. The substrate 140 includes an amorphous silicon film. As previously mentioned, the mask 140 includes light-transmitting portions "N," each of which has first to third rectangular sub-portions N1–N3. Thereafter, the laser beam irradiates the amorphous silicon film through the mask 140 such that amorphous silicon portions 124a–124c, each corresponding to one of the rectangular sub-portions N1–N3, are melted and subsequently crystallized. As shown, each of the amorphous silicon portions 124a–124c is divided into a first grain region 127a and a second grain region 127b. The first grain 127a borders on the second grain region 127b at a middle section 127c. When laser beam irradiation stops, the melted silicon rapidly begins to crystallize at the interface between the solid phase and liquid phase silicon. The first and second grain regions 127a and 127b tend to grow vertically and to collide with each other in the middle section 127c.

After the laser beam irradiation illustrated in FIG. 9A, the X-Y stage or/and the mask 140 moves a distance of several millimeters (mm) in a transverse direction for a subsequent laser beam irradiation. For example, an X-Y stage having the substrate moves left side, or the mask moves right, by a distance equal to the length "P" of the silicon portion 124a.

Figure 9B:
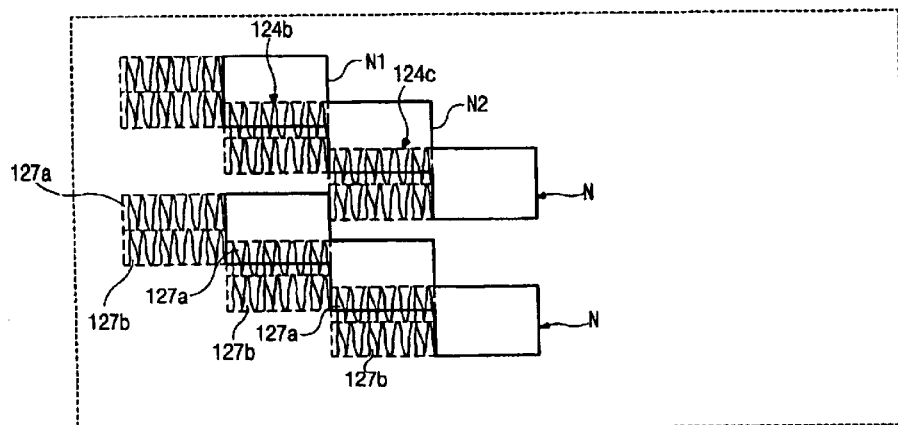
Figure 9C:
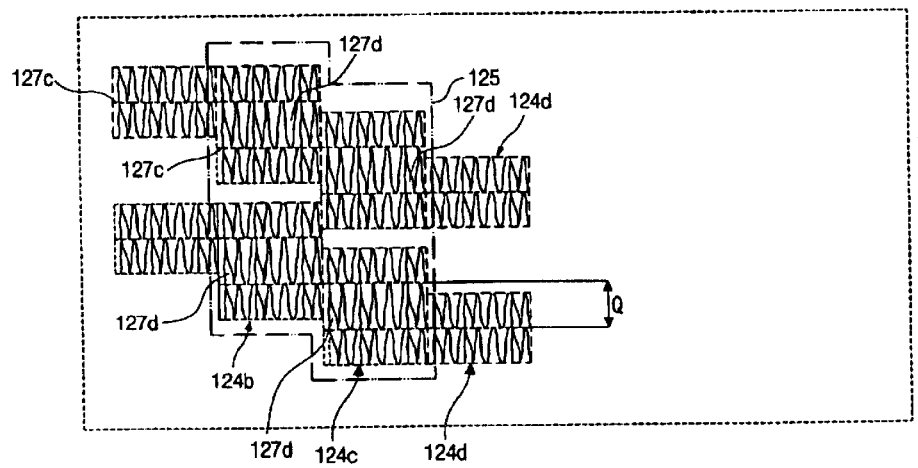

As shown in FIG. 9B, the first to third rectangular sub-portions N1–N3 move right such that the first and second rectangular sub-portions N1 and N2 are arranged respectively above the second and third silicon portions 124b and 124c. Therefore, the first to third sub-portions N1–N3 expose new portions of silicon film. As shown in FIGS. 9B and 9C, since the first and second sub-portions N1 and N2 expose the first grain regions 127a of the second and third silicon portions 124b and 124c, the first grain regions 127a are re-crystallized and the new exposed portions of the silicon film are also crystallized during a second laser beam irradiation.

As indicated in an area 125 of FIG. 9C, third grain region 127d caused by the second laser beam irradiation and crystallization tends to grow to the first grain regions 127a of the second and third silicon portions 124b and 124c of FIG. 9A. Namely, the third grain regions 127c formed by the second laser beam irradiation continue to grow adjacent to the first grain regions 127a formed by the first laser beam irradiation, and thus the grains tend to grow vertically against the middle section 127c where the grains collide during crystallization. Accordingly, the larger grains of the third grain regions 127d, which have a width "Q," can be obtained as shown in FIG. 9C. Furthermore, new fourth crystallized silicon regions 124d are formed adjacent to the third crystallized silicon regions 124c.

Figure 9D:
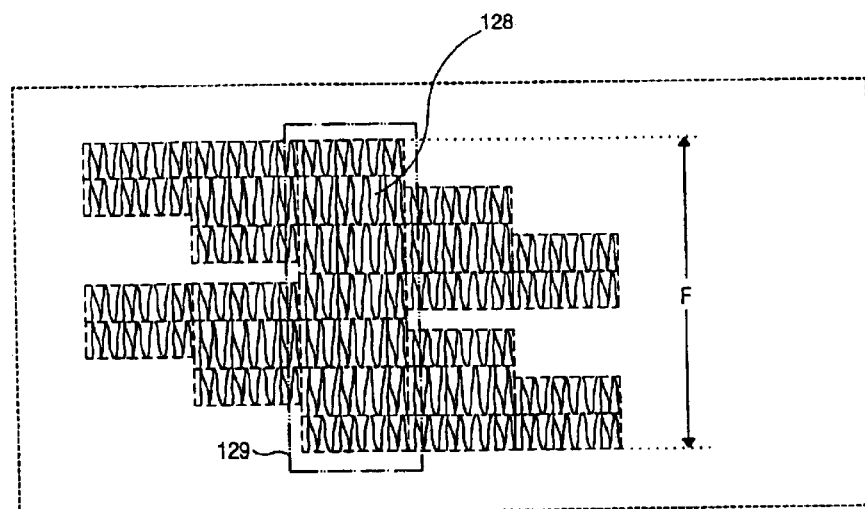
Figure 9E:
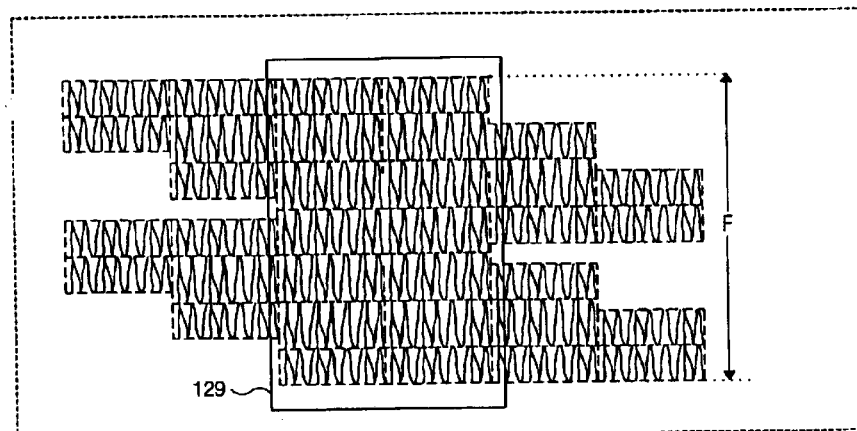
Figure 9F:
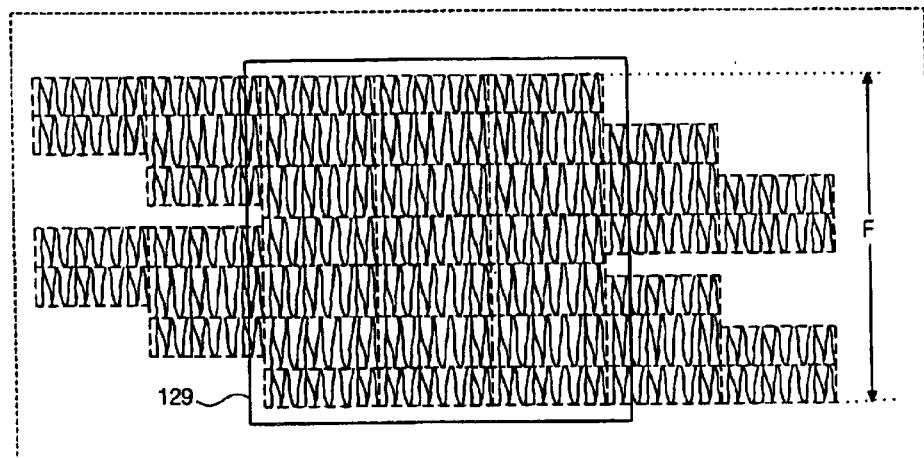

Now referring to FIGS. 9D and 9F, the repetition of the foregoing steps of melting and crystallizing forms larger grains 128 in an area 129 where the grains formed by the light-transmitting portions "N" of FIG. 8 meet. The crystallized area 129 formed by the mask 120 of FIG. 8 becomes larger and has a width "F," as shown in FIGS. 9D to 9F. In the second embodiment of the present invention, the growth of grain is limited, so that relatively short grains are formed in the crystallized area 129. As crystallization continues in the transverse direction (X-axial direction) using the mask of FIG. 8, a plurality of crystallized grain regions are formed in the amorphous silicon film.

Figure 9G:
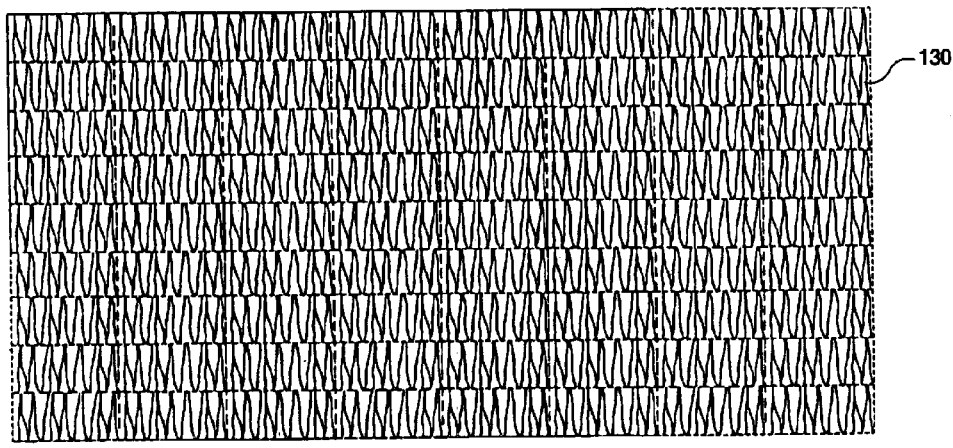

After completing crystallization in the transverse direction (X-axial direction), the X-Y stage or the mask move in a longitudinal direction (Y-axial direction) by a distance of several millimeters. Then, X-axial direction crystallization is performed again. From Y-axial movements and X-axial crystallizations, the entire amorphous silicon film on the substrate is crystallized into a polycrystalline silicon film 130, as shown in FIG. 9G. Compared to the first embodiment, the second embodiment can form a relatively large number of grain regions within a unit area. Furthermore, the second embodiment can crystallize the amorphous silicon film faster than the first embodiment under the same circumstances.

The crystalline silicon layer formed by the first and second embodiments, as described above, can be used as an active layer of a thin film transistor, among other uses, such as driving devices and switching devices.

When the resolution of a liquid crystal display device become greater, the pad pitch of the signal lines and scanning lines is reduced. Thus, it becomes more difficult to bond a TCP (Tape Carrier Package) to the pads. However, SLS grown polycrystalline silicon can be used for driving ICs (Integrated Circuits) and can be formed on the same substrate as the thin film transistors. Such formation of driving ICs on a substrate decreases production costs and can ease fabrication difficulties.

Figure 10:
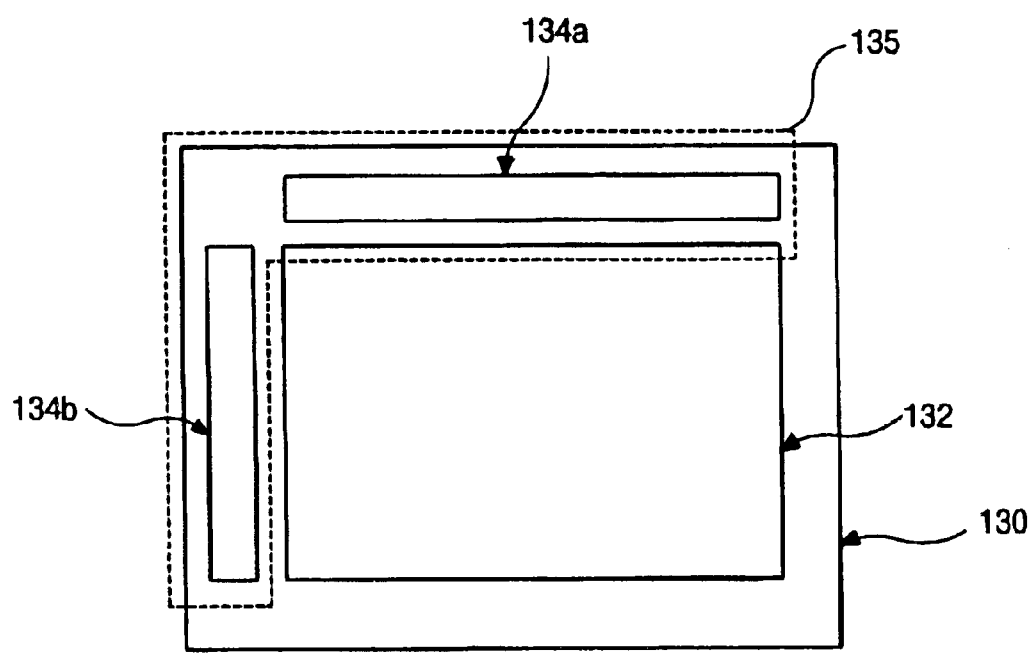
FIG. 10 is a schematic view of a liquid crystal display panel, including a data driving circuit and a gate driving circuit, wherein the crystalline active layers are in accord with the principles of the present invention.

FIG. 10 is a schematic view of a liquid crystal display panel that includes a data driving circuit 134a and a gate driving circuit 134b that use crystalline active layers fabricated according to the present invention.

As shown in FIG. 10, a liquid crystal panel 130 includes a display region 132 and a driving region 135. In the display region 132 are a plurality of switching devices, i.e., thin film transistors (TFTs). The data driving circuit 134a and the gate driving circuit 134b are also disposed in the driving region 134. Those driving circuits 134a and 134b include a plurality of CMOS (Complementary Metal Oxide Semiconductor) devices.

Figure 11:
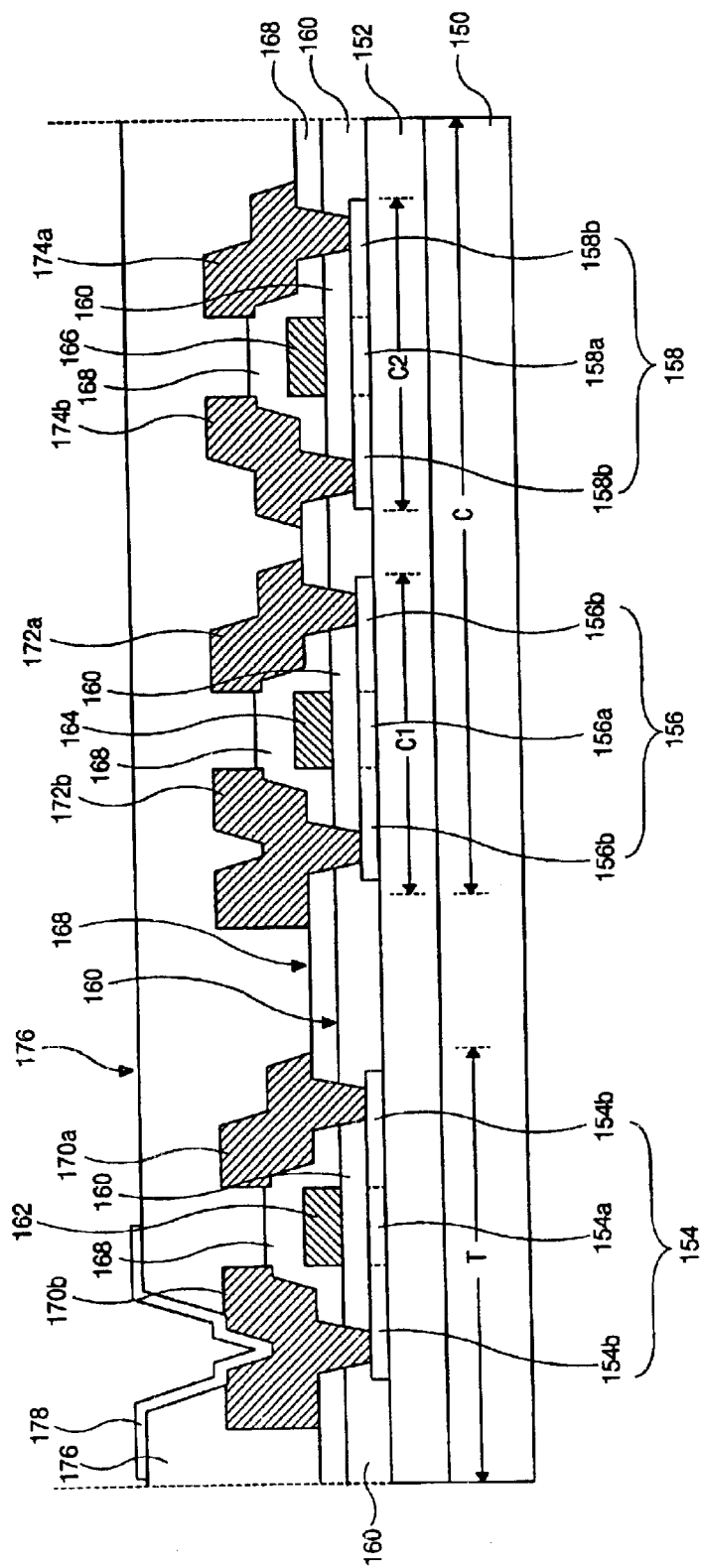
FIG. 11 is a plan view showing a switching device and CMOS transistors.

As shown in FIG. 11, a CMOS device "C" is comprised of an N-type TFT "C1" and a P-type TFT "C2" which are driven by an inverter relative to each other in the normal totem pole fashion. Since a CMOS device "C" consumes little electric power, it is a very suitable driving circuit. Such CMOS devices require fast operating characteristics, characteristics that are meet by active layers comprised of polycrystalline silicon formed by one of above-described inventive methods. Further, since the TFT "T" of FIG. 11 is formed of polycrystalline silicon fabricated according to the principles of the present invention, that TFT has high electron mobility, which improves display quality.

The fabrication process for the CMOS device "C" and the thin film transistor "T" will be explained as follows. At this time, it is supposed that the thin film transistor "T" is an N-type.

First, a buffer layer 152 is formed on a transparent substrate 150. An amorphous silicon (a-Si:H) layer that includes hydrogen is formed on the buffer layer 152. That amorphous silicon is then dehydrogenated. Thereafter, the amorphous silicon layer is crystallized using one of the aforementioned methods (first or second embodiments), thereby forming a polycrystalline silicon layer.

The polycrystalline silicon layer is then patterned to form first to third active layers 154, 156 and 158. The first polycrystalline silicon active layer 154 is divided into an active channel region 154a and two doping regions 154b that are disposed on both sides of the active channel region 154a. Furthermore, the second polycrystalline silicon active layer 156 is divided into an active channel region 156a and two doping regions 156b, and the third polycrystalline silicon active layer 158 is divided into an active layer 158a and two doping regions 158b. A first insulation layer 160 is formed on the buffer layer 152 so as to cover the polycrystalline silicon active layers 154, 156 and 158. Gate electrodes 162, 164 and 166 are then formed on the first insulation layer 160, particularly over the active channel regions 154a, 156a and 158a.

Thereafter, the doping regions 154b, 156b and 158b are doped while using the gate electrodes 162, 164 and 166 as masks. The doping regions 154b and 156b are doped by n+ions, whereas the doping regions 158b are doped by p+ions. Therefore, the transistors "T" and "C1" become N-type transistors and the transistor "C2" becomes a P-type transistor.

Thereafter, a second insulation layer 168 is formed on the first insulation layer 160 to cover the gate electrodes 162, 164 and 166. The first and second insulation layers 160 and 168 are then patterned to form contact holes that expose impurity-doped regions 154b, 156b and 158b. After patterning the first and second insulation layers 160 and 168, a metal layer is formed on the second insulation layer 168. That metal layer is then patterned to form source electrodes 170a, 172a and 174a and drain electrodes 170b, 172b and 174b. As shown in FIG. 11, the source electrodes 170a, 172a and 174a contact the impurity-doped regions 154b, 156b and 158b, respectively, on the right side of the transistors. The drain electrodes 170b, 172b and 174b also contact the impurity-doped regions 154b, 156b and 158b, respectively, on the left side of the transistors. Therefore, the thin film transistor "T" and the CMOS device "C" are formed. A passivation layer 176 is then formed on the second insulation layer 168 to cover all transistors "T", "C1" and "C2". The passivation layer 176 is then patterned to expose a portion of the drain electrode 170b of the thin film transistor "T". Thus, a pixel electrode 178 formed on the passivation layer 176 contacts the drain electrode 170b of the thin film transistor "T".

The switching devices and operating devices shown in FIG. 11 are fabricated using the polycrystalline silicon that is crystallized by the first and second embodiment of the present invention, so that the process time can be substantially shortened and the manufacturing yield increases.

According to the SLS method of the present invention, since the X-Y stage and the mask move a distance of millimeters when crystallizing the amorphous silicon film, the crystallization time and the fabricating process time are dramatically reduced over prior art methods.

It will be apparent to those skilled in the art that various modifications and variations can be made in the method of crystallizing the amorphous silicon without departing from the spirit or scope of the inventions. Thus, it is intended that the present invention cover the modifications and variations of this invention provided they come within the scope of the appended claims and their equivalents.

What is claimed is:

1. A sequential lateral solidification (SLS) mask comprising:
    a light absorptive portion for blocking a laser beam; and
    a plurality of tier-shaped light-transmitting portions for passing a laser beam.

2. The sequential lateral solidification (SLS) mask of claim 1, wherein each tier-shaped light-transmitting portion includes a plurality of rectangular sub-portions that are adjacent each other.

3. The sequential lateral solidification (SLS) mask of claim 2, wherein the width of each rectangular sub-portion is greater than one micrometer.

4. The sequential lateral solidification (SLS) mask of claim 3, wherein the width of each rectangular sub-portion is equal to or less than twice the maximum length of the lateral grain growth that is to be grown by the sequential lateral solidification (SLS) mask.

5. The mask of claim 2, wherein the width of each rectangular sub-portion is equal to or greater than twice the maximum length of the lateral grain growth that is to be grown by the sequential lateral solidification (SLS) mask.

6. The mask of claim 1, wherein adjacent rectangular sub-portions form a step.

7. The mask of claim 6, wherein the step is greater than the maximum length of the lateral grain growth that is to be grown by the sequential lateral solidification (SLS) mask.

8. The mask of claim 6, wherein the step between the adjacent rectangular sub-portions is less than the maximum length of the lateral grain growth that is to be grown by the sequential lateral solidification (SLS) mask.

9. The mask of claim 1, wherein a length of each rectangular sub-portion ranges is greater than two hundred micrometers.

10. A method of crystallizing an amorphous silicon film, comprising;
    locating a substrate having an amorphous silicon film in a sequential lateral solidification (SLS) apparatus;
    irradiating the amorphous silicon film using a laser beam that passes through a mask, wherein the mask includes a light absorptive portion and a plurality of tier-shaped light-transmitting portions, wherein each light-transmitting portion has a plurality of rectangular sub-portions, wherein a width of each rectangular sub-portion is greater than one micrometer and less than ten micrometers, wherein a length of each rectangular sub-portion is greater than 200 micrometers, wherein the laser beam portion that passes through said light-transmitting portions melts the amorphous silicon film in first crystallized regions into liquid silicon, wherein each of said first crystallized regions includes a plurality of silicon sub-portions, each having a first grain region, a second grain region, and a middle section, and wherein silicon grains form in the first and second grain regions by growing laterally from an interface between liquid silicon and solid silicon;
    transversely moving the mask relative to the amorphous silicon film; and
    performing a second crystallization on second crystallized regions such that silicon grains in the second grain regions continue to grow.

11. The method of claim 10, further comprising transversely moving the mask relative to the amorphous silicon film a plurality of times so as to continue growing the silicon grains in the second grain regions until the amorphous silicon film is crystallized in the transverse direction.

12. The method of claim 11, further comprising moving the mask in a longitudinal direction after the amorphous silicon film is crystallized in the transverse direction.

13. The method of claim 12, further comprising conducting a second transverse directional crystallization after moving the mask in the longitudinal direction.

14. The method of claim 13, wherein a step is formed by adjacent tier-shaped light-transmitting portions.

15. The method of claim 14, wherein the step is greater than the maximum length of lateral grain growth of the silicon grains.

16. The method of claim 14, wherein the step is less than the maximum length of lateral growth of the grain.

17. The method of claim 10, wherein the width of each rectangular sub-portion is less then or equal to twice the maximum length of lateral grain growth.

18. The method of claim 17, wherein the middle section of the each silicon sub-portion is a collision region wherein silicon grains collide.

19. The method of claim 10, wherein the width of each rectangular sub-portion is greater than or equal to twice the maximum length of lateral grain growth.

20. The method of claim 19, wherein laser beam irradiation forms polycrystalline silicon particles in the middle section of each first crystallized region.

* * * * *